(12) United States Patent
Kuzumoto et al.

(10) Patent No.: US 9,716,211 B2
(45) Date of Patent: Jul. 25, 2017

(54) SEMICONDUCTOR PHOSPHOR NANOPARTICLE, SEMICONDUCTOR PHOSPHOR NANOPARTICLE-CONTAINING GLASS, LIGHT EMITTING DEVICE, AND LIGHT EMITTING ELEMENT

(71) Applicant: Sharp Kabushiki Kaisha, Sakai-shi, Osaka (JP)

(72) Inventors: Yasutaka Kuzumoto, Sakai (JP); Tatsuya Ryohwa, Sakai (JP); Mami Morishita, Sakai (JP); Noriyuki Yamazumi, Sakai (JP); Makoto Izumi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/208,814

(22) Filed: Jul. 13, 2016

(65) Prior Publication Data

US 2017/0025583 A1  Jan. 26, 2017

(30) Foreign Application Priority Data

Jul. 22, 2015 (JP) .................. 2015-144663
Aug. 25, 2015 (JP) .................. 2015-165722

(51) Int. Cl.
| | | |
|---|---|---|
| H01L 33/50 | (2010.01) | |
| C09K 11/02 | (2006.01) | |
| C30B 29/40 | (2006.01) | |
| C09K 11/62 | (2006.01) | |

(52) U.S. Cl.
CPC ......... *H01L 33/502* (2013.01); *C09K 11/025* (2013.01); *C09K 11/62* (2013.01); *C30B 29/40* (2013.01); *H01L 2933/0041* (2013.01)

(58) Field of Classification Search
CPC ...................................... H01L 33/502
See application file for complete search history.

(56) References Cited

U.S. PATENT DOCUMENTS

| | | | | |
|---|---|---|---|---|
| 6,977,182 | B2* | 12/2005 | Sato ........... | B82Y 30/00 252/301.4 R |
| 8,298,677 | B2* | 10/2012 | Wiesner ............ | B82Y 30/00 428/428 |
| 9,376,616 | B2* | 6/2016 | Morishita ............ | C09K 11/62 |
| 9,410,079 | B2* | 8/2016 | Kuzumoto ........... | C09K 11/025 |
| 2006/0145138 | A1* | 7/2006 | Sato ............ | B82Y 30/00 257/14 |
| 2006/0240258 | A1* | 10/2006 | Sato ............ | C09K 11/565 428/403 |
| 2011/0017951 | A1* | 1/2011 | Ryowa ............ | C09K 11/02 252/301.16 |

(Continued)

FOREIGN PATENT DOCUMENTS

| | | |
|---|---|---|
| JP | 2007-161748 A | 6/2007 |
| JP | 2010-535262 A | 11/2010 |

(Continued)

*Primary Examiner* — Evan Pert
(74) *Attorney, Agent, or Firm* — Keating & Bennett, LLP

(57) ABSTRACT

There is provided a semiconductor phosphor nanoparticle comprising: a nano particle core composed of a compound semiconductor, a first coating layer coating the nano particle core, and a second coating layer bonded to an outer surface of the first coating layer through Si—O bonding.

10 Claims, 11 Drawing Sheets

(56) References Cited

U.S. PATENT DOCUMENTS

| | | | | |
|---|---|---|---|---|
| 2014/0264196 A1* | 9/2014 | Werner | .................. | C23C 16/30 |
| | | | | 252/519.34 |
| 2015/0129814 A1* | 5/2015 | Kuzumoto | ........... | C09K 11/025 |
| | | | | 252/519.2 |
| 2016/0115383 A1* | 4/2016 | Kuzumoto | ........... | C09K 11/703 |
| | | | | 252/301.33 |

FOREIGN PATENT DOCUMENTS

| | | |
|---|---|---|
| JP | 2015-093881 A | 5/2015 |
| JP | 2016-084398 A | 5/2016 |
| WO | 2006/054402 A1 | 5/2006 |
| WO | 2009/016354 A1 | 2/2009 |

* cited by examiner

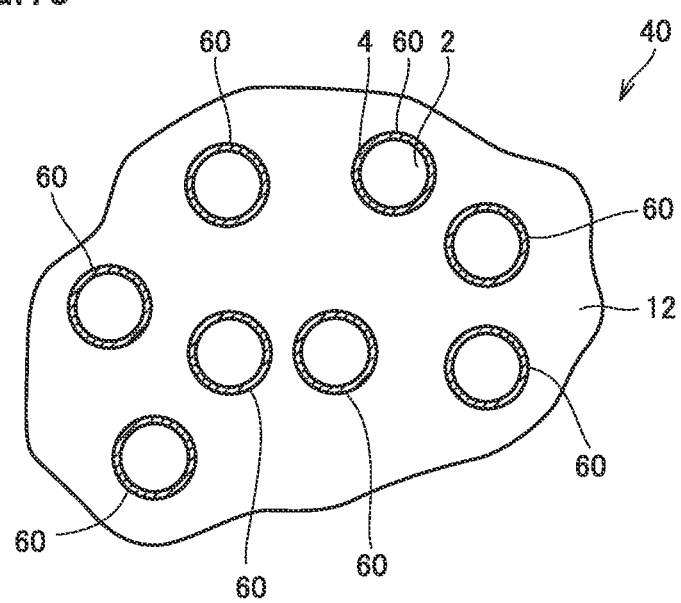

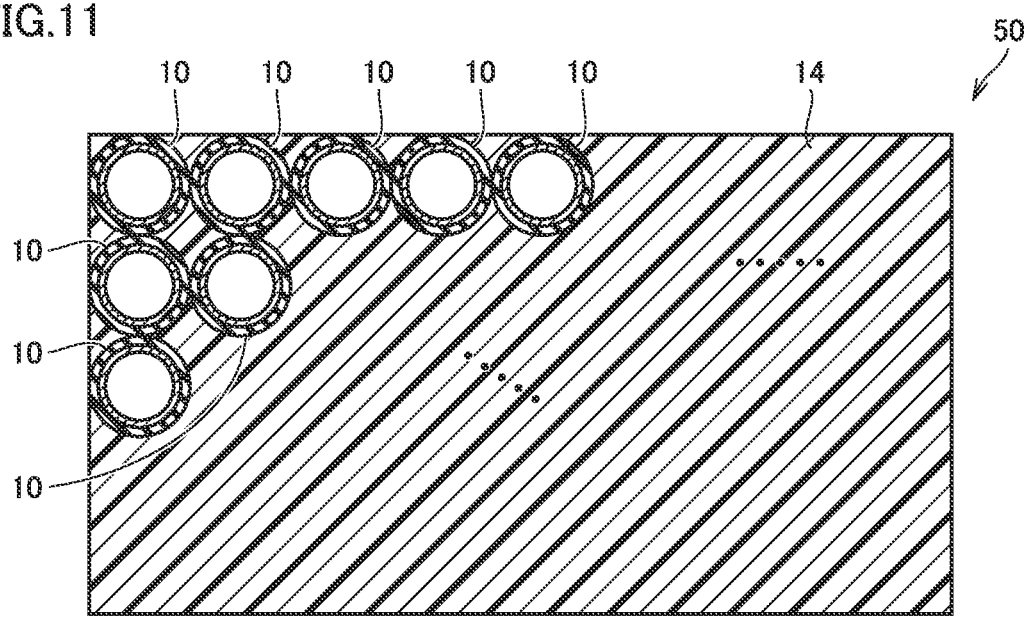

SEMICONDUCTOR PHOSPHOR NANOPARTICLE, SEMICONDUCTOR PHOSPHOR NANOPARTICLE-CONTAINING GLASS, LIGHT EMITTING DEVICE, AND LIGHT EMITTING ELEMENT

This nonprovisional application is based on Japanese Patent Application Nos. 2015-144663 and 2015-165722 filed on Jul. 22, 2015 and Aug. 25, 2015, respectively, with the Japan Patent Office, the entire contents of which are hereby incorporated by reference.

BACKGROUND OF THE INVENTION

Field of the Invention

The present invention relates to a semiconductor phosphor nanoparticle, a semiconductor phosphor nanoparticle containing glass, a light emitting device, and a light emitting element.

Description of the Background Art

It is known that when a semiconductor nanoparticle is reduced in size to about an excitonic Bohr-radius, it presents a quantum size effect. The quantum size effect is that when a substance is reduced in size an electron in the substance cannot move freely and the electron's energy is not arbitrary and can only assume a particular value. Furthermore, it is known that as the semiconductor nanoparticle, which confines an electron, varies in size, the electron's energy state also varies, and the semiconductor nanoparticle smaller in dimension generates light shorter in wavelength. The semiconductor nanoparticle which presents such a quantum size effect attracts attention for its use as a phosphor and is further researched.

A semiconductor phosphor nanoparticle has high surface activity and accordingly easily aggregates. Accordingly, in order to prevent the aggregation, a method of modifying the nanoparticle's surface with a protective material such as an organic modifying group, is proposed.

Japanese National Patent Publication No. 2010-535262 describes that a modifying group having a carboxylate group and a straight chain alkyl group is used to modify a nanoparticle's surface to obtain a semiconductor phosphor nanoparticle having satisfactory dispersibility in an organic solvent and also having satisfactory fluorescent quantum efficiency.

A semiconductor phosphor nanoparticle normally has a surface with many defects, which serve as a cause of non-radiation deactivation. Since a semiconductor phosphor nanoparticle has a large ratio of surface area to volume per particle and the defects have a large effect on reduction in emission efficiency. Accordingly, a method of enhancing a semiconductor phosphor nanoparticle's emission efficiency by deactivating surface defects, is proposed.

As a first method is indicated coating a surface of a semiconductor nanoparticle with another semiconductor having a large band gap. According to this method, however, a difference in lattice constant between the semiconductors having different band gaps causes distortion in an interface and hence impaired emission characteristics.

As a second method is indicated bonding an organic surfactant to a surface of the semiconductor nanoparticle. According to this method, however, the defects of the surface of the semiconductor nanoparticle cannot all be coated due to a steric hindrance of organic surfactants.

Furthermore, a semiconductor phosphor nanoparticle synthesized in a solution has particles gradually aggregated or the like immediately after it is synthesized, and the semiconductor phosphor nanoparticle thus has degraded emission characteristics, and in particular, a nanoparticle synthesized in a non-aqueous solution is weak against moisture, and is rapidly declined in fluorescence by coexistence of a small amount of moisture, and furthermore, in the form of a solution of nanoparticles, it is difficult to apply it in engineering as a material.

Japanese Patent Laying-Open No. 2007-161748 discloses a method to stabilize a phosphor by coating a surface thereof with a covalently bonded organic thin film.

SUMMARY OF INVENTION

However, when the semiconductor phosphor nanoparticle of Japanese National Patent Publication No. 2010-535262 is glass-sealed using organoalkoxysilane or resin-sealed using a macromolecular material, it is decreased in quantum efficiency.

The semiconductor phosphor nanoparticle of Japanese National Patent Publication No. 2010-535262 has a carboxylate group bonded to a surface of the nanoparticle, although the bonding strength is weak. As such, when the semiconductor phosphor nanoparticle is glass-sealed or resin-sealed, the bond between the carboxylate group and the nanoparticle's surface will be dissociated by stress caused as organoalkoxysilane or the macromolecular material causes condensation reaction near a surface of the semiconductor phosphor nanoparticle. This is believed to cause defects in the nanoparticle's surface and result in impaired quantum efficiency.

Furthermore, in various processes using the phosphor nanoparticle, if water can be used as a solvent, there are merits such as low environmental burden and low cost. Accordingly, there is a demand for a phosphor nanoparticle having good dispersibility in an aqueous solution. However, the phosphor nanoparticle of Japanese National Patent Publication No. 2010-535262 does not have satisfactory dispersibility in water.

Accordingly, a first object of the present invention is to provide a phosphor nanoparticle and light emitting element that have satisfactory quantum efficiency even when glass-sealed or resin-sealed, and furthermore, have excellent dispersibility in water.

In the technique of Japanese Patent Laying-Open No. 2007-161748, the phosphor itself degrades in the step of forming the organic thin film on the surface of the phosphor. This impairs the phosphor's emission characteristics, which is an issue to be addressed in the art.

A second object of the present invention is to provide a semiconductor phosphor nanoparticle, a semiconductor phosphor nanoparticle-containing glass, and a light emitting device using that semiconductor phosphor nanoparticle, that exhibit high emission efficiency and also have excellent chemical stability.

The present invention is a semiconductor phosphor nanoparticle comprising: a nano particle core composed of a compound semiconductor, a first coating layer coating the nano particle core, and a second coating layer bonded to an outer surface of the first coating layer through Si—O bonding.

The present invention is a semiconductor phosphor nanoparticle-containing glass comprising: silica-based glass; and a semiconductor phosphor nanoparticle dispersed in the silica-based glass, the semiconductor phosphor nanoparticle including a semiconductor nanoparticle containing a group 15 element in the periodic table of elements, that is at least one type selected from the group consisting of phosphorus, arsenic, antimony and bismuth, and a first coating layer formed on a surface of the semiconductor nanoparticle and including the group 15 element and an oxygen atom, an outer surface of the first coating layer and the silica-based glass being bonded through siloxane bonding.

The present invention is a light emitting device comprising an organic medium and the above semiconductor phosphor nanoparticle dispersed in the organic medium.

The present invention is a light emitting element comprising a matrix and a semiconductor phosphor nanoparticle dispersed in the matrix, the semiconductor phosphor nanoparticle including a nano particle core composed of a compound semiconductor, a first coating layer coating the nano particle core, and a second coating layer bonded to an outer surface of the first coating layer through Si—O bonding.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 10 is a schematic diagram showing a semiconductor phosphor nanoparticle-containing glass according to the present invention.

FIG. 11 is a schematic diagram showing a light emitting device according to the present invention.

DESCRIPTION OF THE PREFERRED EMBODIMENTS

Figure 1:
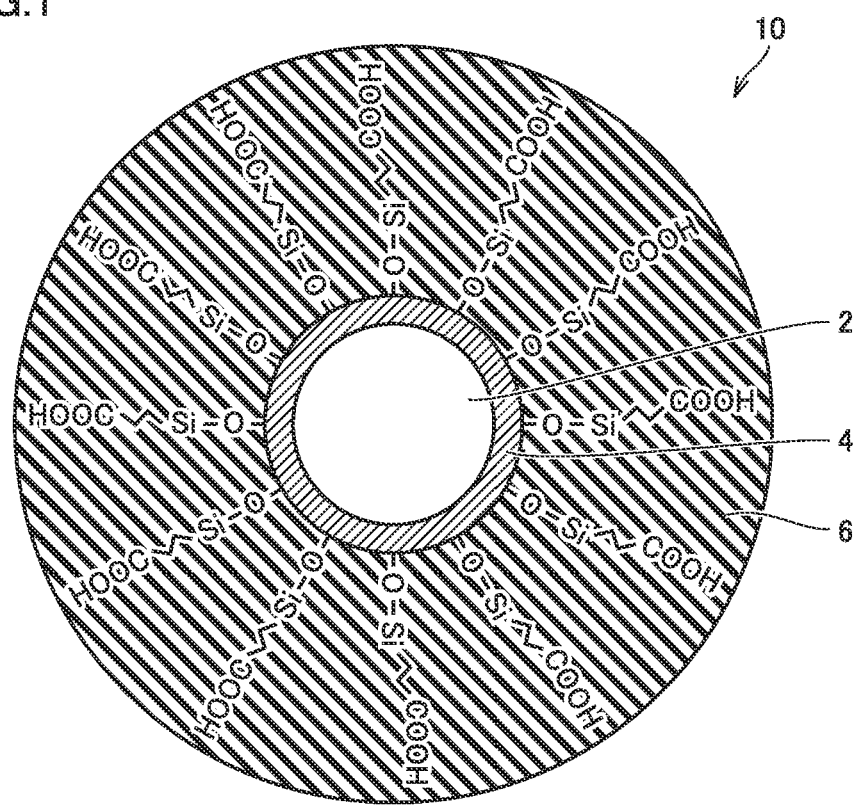
FIG. 1 is a schematic diagram showing a semiconductor phosphor nanoparticle according to a first embodiment.

Hereafter, in the figures of the subject application, identical characters indicate identical or corresponding components. Furthermore, in the drawings, length, size, width and other dimensional relationships are changed as appropriate for clarification and simplification of the drawings, and do not represent actual dimensions.

<Semiconductor Phosphor Nanoparticle>

First Embodiment

Figure 2:
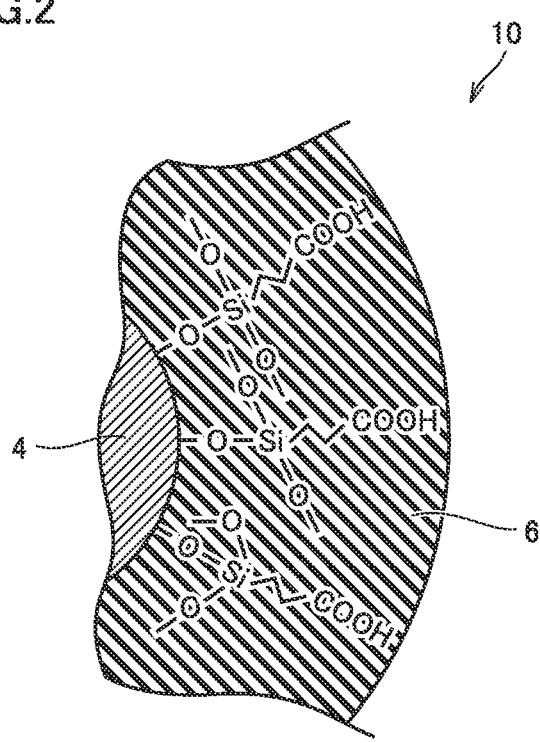
FIG. 2 is an example in an enlarged view of a modifying organic compound layer portion in the semiconductor phosphor nanoparticle according to the first embodiment.
Figure 3:
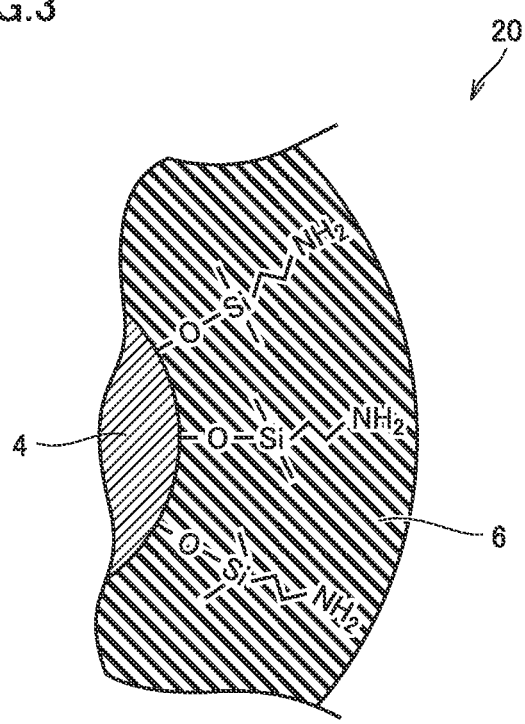
FIG. 3 is an example in an enlarged view of a modifying organic compound layer portion in a semiconductor phosphor nanoparticle according to the first embodiment.

A semiconductor phosphor nanoparticle according to a first embodiment will now be described with reference to FIG. 1 to FIG. 3. FIG. 1 is a schematic diagram showing the semiconductor phosphor nanoparticle according to the first embodiment. FIGS. 2 and 3 each show an example in an enlarged view of a modifying organic compound layer portion in the semiconductor phosphor nanoparticle according to the first embodiment.

As shown in FIG. 1, semiconductor phosphor nanoparticle 10 includes a nano particle core 2 composed of a compound semiconductor, a coating layer composed of a shell layer 4 coating said nano particle core 2, and a modifying organic compound layer 6 bonding to an outer surface of said shell layer 4 through Si—O bonding. Said modifying organic compound layer 6 has a surface with a polar functional group.

Semiconductor phosphor nanoparticle 10 is a nanosized phosphor particle having a diameter equal to or greater than 0.1 nm and equal to or less than 100 nm. The size of the semiconductor phosphor nanoparticle can be measured using a scanning electron microscope or a transmission electron microscope or the like.

Nano particle core 2 is composed of a compound semiconductor. The compound semiconductor composing nano particle core 2 has a composition of InN, InP, InGaN, InGaP, AlInN, AlInP, AlGaInN, AlGaInP, etc., for example. The compound semiconductor of such a composition has a bandgap energy which emits visible light of a wavelength of 380 nm to 780 nm. Accordingly, by controlling the particle's diameter and its mixed crystal ratio, a nano particle core allowing any visible emission can be formed.

Preferably, InP or GaP is used as a semiconductor composing nano particle core 2. This is because InP and GaP are composed of a small number of materials and hence easy to produce, and in addition, they are materials presenting high quantum yield and present high emission efficiency when they are exposed to LED light. Quantum yield as referred to herein is a ratio of the number of photons emitting light as fluorescence relative to the number of absorbed photons.

Shell layer 4 is composed of a compound semiconductor formed succeeding the crystal structure of nano particle core 2. Shell layer 4 is a layer formed by growing a semiconductor crystal on a surface of nano particle core 2, and nano particle core 2 and shell layer 4 are bonded by a chemical bond. Preferably, the shell layer is at least one selected from the group consisting of GaAs, GaP, GaN, GaSb, InAs, InP, InN, InSb, AlAs, AlP, AlSb, MN, ZnO, ZnS, ZnSe, and ZnTe, for example. Preferably shell layer 4 has a thickness of approximately 0.1-10 nm. Furthermore, shell layer 4 may have a multilayer structure composed of a plurality of shell layers.

Shell layer 4 has an outer surface firmly bonded to modifying organic compound layer 6 through Si—O bonding. Modifying organic compound layer 6 is formed by causing a modifying organic compound to react to bond it to the outer surface of shell layer 4. Thus, a dangling bond of a surface of shell layer 4 is capped by the modifying organic compound and a surface defect of shell layer 4 is suppressed, and nano particle core 2 is thus improved in emission efficiency.

Semiconductor phosphor nanoparticle 10 of the present embodiment that has a surface with modifying organic compound layer 6 can prevent semiconductor phosphor nanoparticles 10 from aggregating together. This helps to disperse the semiconductor phosphor nanoparticle in a glass material, a macromolecular material and the like.

Semiconductor phosphor nanoparticle 10 of the present embodiment includes shell layer 4 having an outer surface firmly bonded to modifying organic compound layer 6 through Si—O bonding. As such, after semiconductor phosphor nanoparticle 10 is dispersed in the glass material, the macromolecular material or the like when a vitrification or resinification process is performed, modifying organic compound layer 6 is not ripped off a surface of shell layer 4 by the stress caused by the condensation reaction of the glass material or the macromolecular material, and reduction in emission efficiency can be suppressed.

Preferably, the modifying organic compound has a silyl-based functional group capable of firmly bonding to shell layer 4. Causing the modifying organic compound to react with the outer surface of shell layer 4 allows the silyl-based functional group to serve as a portion bonding to shell layer 4 and form Si—O bonding. Indicated as the silyl-based functional group are, for example: alkoxysilyl groups, such as a monomethoxysilyl group, a monoethoxysilyl group, a trimethoxysilyl group, a triethoxysilyl group; chlorosilyl groups, such as a monochlorosilyl group and a trichlorosilyl group; and a bromosilyl group, such as a monobromosilyl group.

Preferably, the silyl-based functional group in the modifying organic compound is a monoalkoxysilyl group. Causing the modifying organic compound including the monoalkoxysilyl group to react with the outer surface of shell layer 4 allows the silyl-based functional group to serve as a portion bonding to shell layer 4 and form Si—O bonding. In that case, as shown in FIG. 3, a silicon atom configuring the Si—O bonding is bonded to one oxygen atom. In other words, in semiconductor phosphor nanoparticle 20, each modifying organic compound bonds to shell layer 4 through Si—O bonding of a single location, and no other Si—O bonding exists in modifying organic compound layer 6 and no oxygen atom exists that reacts with the glass material or the macromolecular material. Thus when semiconductor phosphor nanoparticle 20 is glass-sealed or resin-sealed, no stress is generated in a vicinity of shell layer 4 and the modifying organic compound does not come off, and it can thus suppress a defect caused in a surface of shell layer 4 and maintain satisfactory emission efficiency.

Preferably, the modifying organic compound has the polar functional group at a terminal. Causing the modifying organic compound to react with the outer surface of shell layer 4 allows the polar functional group to be disposed at a surface of modifying organic compound layer 6. This allows semiconductor phosphor nanoparticle 10 to have a surface having good affinity with the water of a polar solvent and hence have water solubility. Thus semiconductor phosphor nanoparticle 10 can be satisfactorily dispersed in water. This allows a process such as using an aqueous dispersion having semiconductor phosphor nanoparticle 10 dispersed in water. A process using water is a lower environmental burden and of a lower cost than a process using an organic solvent.

While FIG. 1 shows a carboxyl group as a polar functional group, the polar functional group is not limited thereto. Indicated as the polar functional group are a carboxyl group, a hydroxyl group, a thiol group, a cyano group, a nitro group, an ammonium group, an imidazolium group, a sulfonium group, a pyridinium group, a pyrrolidinium group, a phosphonium group, and the like.

Preferably, the polar functional group in the modifying organic compound is an ionic functional group. The ionic functional group is high in polarity, and the semiconductor phosphor nanoparticle having a surface with the ionic functional group is significantly excellent in dispersibility in water. Furthermore, when the semiconductor phosphor nanoparticle is sealed in a resin including a constitutional unit derived from an ionic liquid, an electrostatic effect by the ionic liquid's positive and negative charges significantly enhances the semiconductor phosphor nanoparticle's stability.

Note that in the present specification an "ionic liquid" means a salt in a molten state even at ordinary temperature (e.g., 25 degrees centigrade) (i.e., a salt molten at ambient temperature) and is represented by the following general formula (1):

$$X^+Y^- \qquad (1).$$

In the above general formula (1), $X^+$ represents a cation selected from an imidazolium ion, a pyridinium ion, a phosphonium ion, an aliphatic quaternary ammonium ion, pyrrolidinium, sulfonium. Inter alia, an aliphatic quaternary ammonium ion is a particularly preferable cation as it has thermally and atmospherically excellent stability.

Furthermore, in the above general formula (1), $Y^-$ represents an anion selected from a tetrafluoroboric acid ion, a hexafluorophosphoric acid ion, a bistrifluoromethylsulfonyl imidic acid ion, a perchlorate ion, a tris(trifluoromethylsulfonyl) carbon acid ion, a trifluoromethanesulfonic acid ion, a trifluoroacetic acid ion, a carboxylate ion, and a halogen ion. Inter alia, a bistrifluoromethylsulfonyl imidic acid ion is a particularly preferable anion as it has thermally and atmospherically excellent stability.

Indicated as the ionic functional group are an ammonium group, an imidazolium group, a sulfonium group, a pyridinium group, a pyrrolidinium group, a phosphonium group, and the like.

The modifying organic compound is not structurally limited as long as it has the above described silyl-based functional group, and a polar functional group at a terminal thereof. The modifying organic compound can be a modifying organic compound represented for example by the following formula (2):

$$A\text{-}B\text{—}R \qquad (2),$$

where A represents a silyl-based functional group selected from the group consisting of a monomethoxysilyl group, a monoethoxysilyl group, a trimethoxysilyl group, a triethoxysilyl group, a monochlorosilyl group, a trichlorosilyl group, and a monobromosilyl group, B represents an alkyl chain represented by $(CH_2)_n$, where n is an integer of 2-50, which may have a side chain and may have a principal chain including a structure other than —$CH_2$— (such as —NH— etc.), and R represents a polar functional group selected from the group consisting of a carboxyl group, a hydroxyl group, a thiol group, a cyano group, a nitro group, an ammonium group, an imidazolium group, a sulfonium group, a pyridinium group, pyrrolidinium group, and a phosphonium group.

Modifying organic compound layer 6 formed by bonding to shell layer 4 the modifying organic compound represented by the above formula (2) bonds to a surface of shell layer 4 through Si—O bonding, includes a polar functional group at a surface thereof, and has the Si—O bonding and the polar functional group bonded via an alkyl chain of a carbon number of 2-50. The alkyl chain may have a side chain and may have a principal chain including a structure other than —$CH_2$— (such as —NH— etc.).

Specifically, used as the modifying organic compound are n-trimethoxysilyl butanoic acid (TMSBA), 3-aminopropyldimethylethoxysilane (APDMES), 3-aminopropyltrimethoxysilane (APTMS), N-trimethoxysilylpropyl-N, N, N-trimethyl ammonium chloride (TMSP-TMA), 3-(2- aminoethylamino)propyltrimethoxysilane (AEAPTMS), 2-cyanoethyltriethoxysilane, and the like.

Second Embodiment

Figure 4:
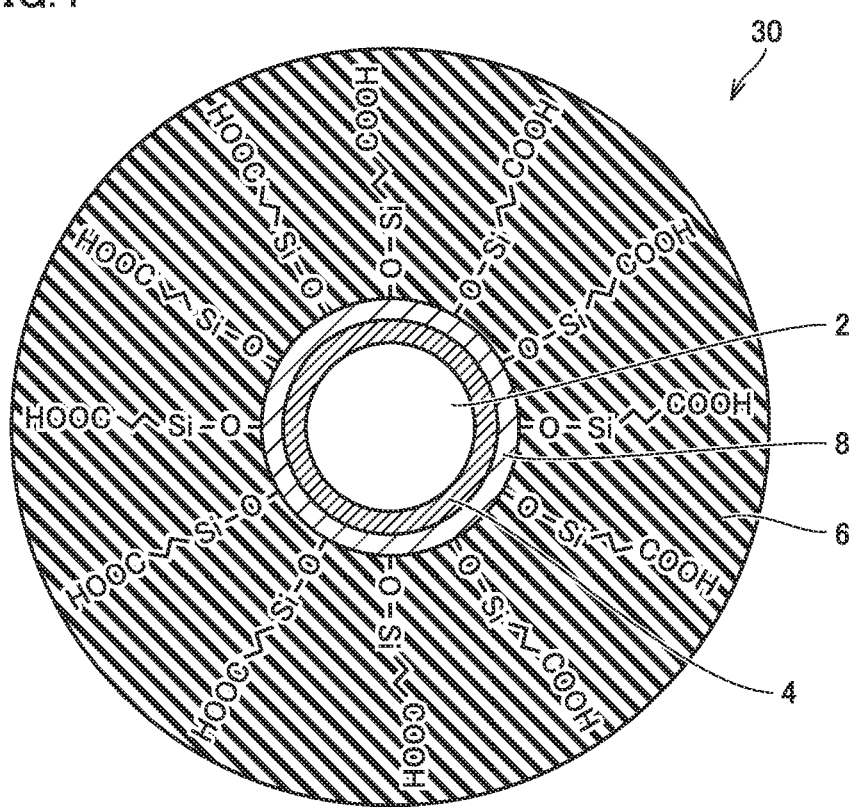
FIG. 4 is a schematic diagram of a modifying organic compound layer portion in a semiconductor phosphor nanoparticle according to a second embodiment.

A semiconductor phosphor nanoparticle according to a second embodiment will now be described with reference to FIG. 4. FIG. 4 is a schematic diagram showing the semiconductor phosphor nanoparticle according to the second embodiment.

The second embodiment provides a semiconductor phosphor nanoparticle 30 basically having a configuration similar to that of the semiconductor phosphor nanoparticle of the first embodiment. It is different from the first embodiment in that the coating layer is composed of shell layer 4 coating the nano particle core and a buffer layer 8 coating shell layer 4, and buffer layer 8 has an outer surface with modifying organic compound layer 6 bonded thereto through Si—O bonding.

Preferably, buffer layer 8 is composed of an oxide-based material. This allows modifying organic compound layer 6 to firmly bond to buffer layer 8. When semiconductor phosphor nanoparticle 30 is glass-sealed or resin-sealed, the modifying organic compound does not come off, and it can suppress a defect caused in a surface of buffer layer 8 and maintain satisfactory emission efficiency.

Buffer layer 8 can be composed of an oxide material such as ZnO, $In_2O_3$, $SnO_2$, SnO, $Al_2O_3$, $TiO_2$, etc. for example.

Third Embodiment

Figure 6:
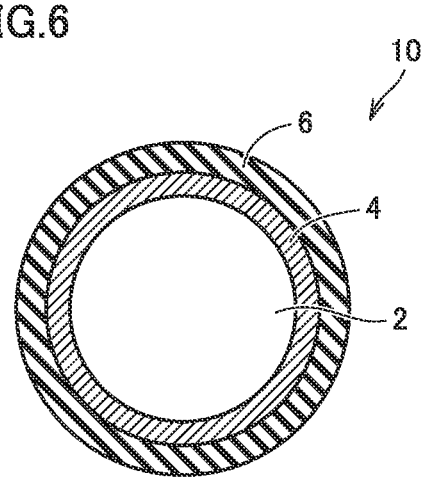
FIG. 6 is a schematic diagram showing a semiconductor phosphor nanoparticle according to a third embodiment.
Figure 7:
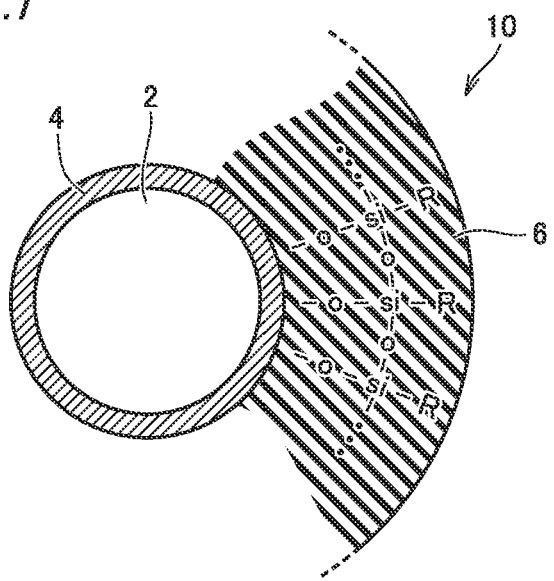
FIG. 7 is an enlarged view of a second coating layer portion in the semiconductor phosphor nanoparticle according to the third embodiment.

A semiconductor phosphor nanoparticle according to a third embodiment will now be described with reference to FIG. 6 and FIG. 7. FIG. 6 is a schematic diagram showing the semiconductor phosphor nanoparticle according to the third embodiment. FIG. 7 is an enlarged view of a second coating layer portion in the semiconductor phosphor nanoparticle shown in FIG. 6.

As shown in FIG. 6, semiconductor phosphor nanoparticle 10 includes a semiconductor nanoparticle 2 including a group 15 element in the periodic table of elements, that is at least one type selected from the group consisting of phosphorus, arsenic, antimony and bismuth, a first coating layer 4 formed on a surface of said semiconductor nanoparticle 2 and including said group 15 element and an oxygen atom, and a second coating layer 6 bonding to an outer surface of said first coating layer 4 through Si—O bonding.

Semiconductor nanoparticle 2 includes a group 15 element in the periodic table of elements, that is at least one type selected from the group consisting of phosphorus (P), arsenic (As), antimony (Sb) and bismuth (Bi). Preferably, semiconductor nanoparticle 2 further includes a group 13 element of the periodic table of elements, such as indium (In), cadmium (Cd), zinc (Zn), and gallium (Ga). That is, preferably, semiconductor nanoparticle 2 is a group III-V compound semiconductor.

As semiconductor nanoparticle 2 can be used a semiconductor nano particle core composed of a semiconductor crystal of one type such as InP, InAs, InSb, InBi, GaP, and GaAs, for example. The compound semiconductor of such a composition has a bandgap energy which emits visible light of a wavelength of 380 nm to 780 nm. Accordingly, by controlling the semiconductor nanoparticle's particle diameter and its mixed crystal ratio, a semiconductor nano particle core allowing any visible emission can be formed.

Preferably, InP or GaP is used as a semiconductor configuring semiconductor nano particle core 2. This is because InP and GaP are composed of a small number of materials and hence easy to produce, and in addition, they are materials presenting high quantum yield and present high emission efficiency when they are exposed to LED light. Quantum yield as referred to herein is a ratio of the number of photons emitting light as fluorescence relative to the number of absorbed photons.

Furthermore, a semiconductor nanoparticle of a core/shell structure in which a shell layer is formed on a surface of a semiconductor nano particle core can also be used as semiconductor nanoparticle 2 (hereinafter, in this paragraph, for A/B, A represents a core and B represents a shell). As a semiconductor nanoparticle of the core/shell structure, InP/GaP can be used, for example Preferably the shell layer has a thickness of approximately 0.1-10 nm.

Semiconductor nanoparticle 2 has a particle diameter preferably in a range of 0.1 nm to 10 μm, more preferably a range of 0.5 nm to 1 μm, still more preferably a range of 1-20 nm. Semiconductor nanoparticle 2 having a particle diameter less than 0.1 nm has a tendency to result in a band gap larger than energy corresponding to visible emission and also make it difficult to control it. Furthermore, semiconductor nanoparticle 2 having a particle diameter exceeding 10 μm has a tendency to result in larger light scattering on the surface of the phosphor and easily cause degradation of characteristics such as emission efficiency. Furthermore, in the semiconductor phosphor nanoparticle of the present invention when semiconductor nanoparticle 2 has a particle diameter equal to or less than twice the Bohr radius, a quantum size effect widens the optical band gap, and even in that case, it is preferable that the band gap be in the above described band gap range. As a matter of course, the above two control means may both be used for adjustment.

First coating layer 4 formed on the surface of semiconductor nanoparticle 2 is an oxide layer that is formed by terminating with oxygen at least a portion of a group 15 element present in a surface area of the semiconductor nanoparticle and includes a group 15 element and oxygen. Note that the group 15 element which is present in first coating layer 4 is originally present in the surface area of semiconductor nanoparticle 2, and accordingly, it can also be understood as being included in semiconductor nanoparticle 2, however, in the present specification, the group 15 element is discussed as being included in first coating layer 4.

In first coating layer 4, the group 15 element and an oxygen atom are firmly bonded via a covalent bond. Accordingly, semiconductor nanoparticle 2 has a surface firmly protected by first coating layer 4. Accordingly, semiconductor nanoparticle 2 coated with first coating layer 4 is improved in chemical stability.

In semiconductor phosphor nanoparticle 10, on an outer surface of first coating layer 4, second coating layer 6 is formed which bonds to the outer surface of first coating layer 4 through Si—O bonding and includes said Si—O bonding. Second coating layer 6 is formed by causing a silane-based modifying agent to react with the outer surface of first coating layer 4.

The silane-based modifying agent is a silicon compound represented by the following general formula:

$$R—Si(OR')_3 \qquad (3),$$

where R represents an amino group, an epoxy group, a methacrylic group, an aminopropyl group, a glycidoxy group, a methacryloxy group, an N-phenylaminopropyl group, a mercapto group, a vinyl group, or the like, and R' represents a methyl group, an ethyl group, or an acetyl group. Specifically indicated are N-2-(aminoethyl)-3-aminopropyldimethoxysilane, N-2-(aminoethyl)-3-aminopropyltrimethoxysilane, 3-aminopropyltrimethoxysilane, 3-aminopropyltriethoxysilane, N-phenyl-3-aminopropyltrimethoxysilane, 3-glycidoxypropylmethyldimethoxysilane, 3-glycidoxypropyltrimethoxysilane, 3-glycidoxypropylmethyldiethoxysilane, 3-glycidoxypropyltriethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, 3-mercaptopropylmethyldimethoxysilane, 3-mercaptopropyltrimethoxysilane, vinyltrimethoxysilane, vinyltriethoxysilane, and the like.

The silane-based modifying agent is hydrolyzed with water to produce a silanol group. The silanol group forms a hydrogen bond with an oxygen atom contained in the first coating layer or performs dehydrating condensation reaction to form a chemical bond. Furthermore, a plurality of hydrolyzed silane-based modifying agents bond together through siloxane bonding to form the second coating layer.

Accordingly, the second coating layer firmly bonds to the first coating layer. This improves the semiconductor phosphor nanoparticle's chemical stability.

By selecting the types of the functional groups which are included in the silane-based modifying agent and represented as R and R in the above formula (3), dispersibility in an organic medium can be enhanced and reactivity with an organic polymer can be imparted. For example, using as the functional group an amino group, an aminopropyl group, a glycidoxy group, a vinyl group, a styryl group, a methacrylic group, an acrylic group, an amino group, a ureido group, a mercapto group, a sulfide group, an isocyanate group or the like can enhance dispersibility in an organic medium. Furthermore, using an epoxy group, an unsaturated hydrocarbon group, etc. as the functional group can impart reactivity with an organic polymer.

Fourth Embodiment

Figure 8:
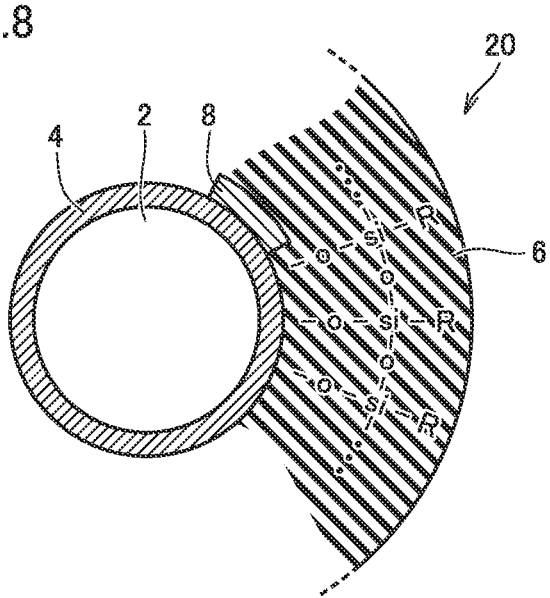
FIG. 8 is a schematic diagram showing a semiconductor phosphor nanoparticle according to a fourth embodiment.

A semiconductor phosphor nanoparticle according to a fourth embodiment will now be described with reference to FIG. 8. FIG. 8 is a schematic diagram showing a semiconductor phosphor nanoparticle according to the fourth embodiment and shows a portion of the second coating layer in an enlarged view.

The fourth embodiment provides a semiconductor phosphor nanoparticle 20 basically having a configuration similar to that of semiconductor phosphor nanoparticle 10 of the third embodiment. It is different from the third embodiment in that the former has an inorganic crystal 8 having a band gap of 3.0 eV or larger on at least a portion of an outer surface of first coating layer 4.

As inorganic crystal 8 has a band gap of 3.0 eV or larger, it absorbs ultraviolet rays. Accordingly, semiconductor nanoparticle 2 can be prevented from being degraded by ultraviolet rays, and thus improved in chemical safety. As the inorganic crystal, a wide gap semiconductor nanoparticle such as $ZnO$, $TiO_2$, $ZrO_2$, $Al_2O_3$, $ZnO:Mg$, $ZnO:Be$, can be used, for example.

While FIG. 8 shows inorganic crystal 8 formed on a portion of the outer surface of first coating layer 4, inorganic crystal 8 may be formed to coat the outer surface of first coating layer 4 entirely.

Fifth Embodiment

Figure 9:
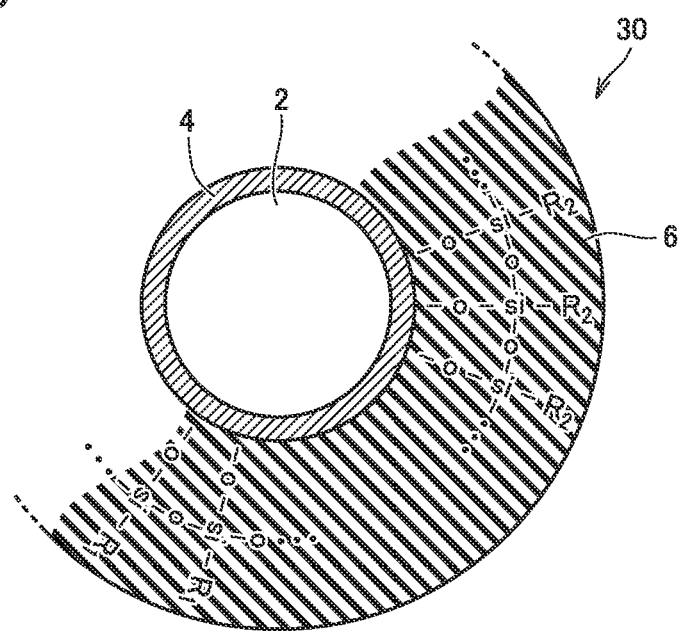
FIG. 9 is a schematic diagram showing a semiconductor phosphor nanoparticle according to a fifth embodiment.

A semiconductor phosphor nanoparticle according to a fifth embodiment will now be described with reference to FIG. 9. FIG. 9 is a schematic diagram showing the semiconductor phosphor nanoparticle according to the fifth embodiment and shows a portion of the second coating layer in an enlarged view.

The fifth embodiment provides a semiconductor phosphor nanoparticle 30 basically having a configuration similar to that of semiconductor phosphor nanoparticle 10 of the third embodiment. It is different from the third embodiment in that two or more types of functional groups $R_1$ and $R_2$ are bonded to a silicon atom present in Si—O bonding included in second coating layer 6. Note that while in FIG. 9 modifying organic compounds each including a silicon atom having an identical functional group form siloxane bonding, the siloxane bonding may be formed of a plurality of modifying organic compounds each including a silicon atom with a different functional group bonded thereto.

When two or more types of functional groups are each bonded to a silicon atom of Si—O bonding, the interface surface energy of the surface of the semiconductor nanoparticle can be finely adjusted by combining the functional groups, and the dispersibility of semiconductor phosphor nanoparticle 30 in an organic medium can be improved.

As functional group $R_1$, $R_2$ bonding to a silicon atom in Si—O bonding are indicated an aminopropyl group, a glycidoxy group, a methacryloxy group, an N-phenylaminopropyl group, a mercapto group, a vinyl group, and the like.

<Method of Producing Semiconductor Phosphor Nanoparticle>

[First Production Method]

A method of producing semiconductor phosphor nanoparticle 10 according to the first embodiment is not limited in particular, and may be any production method. Preferably, a chemical synthesis method is used as the method of producing semiconductor phosphor nanoparticle 10 as the method is a simple and is of a low cost. In the chemical synthesis method, a plurality of starting materials including elements to constitute a substance to be produced can be dispersed in a medium and then made to react to obtain the substance to be produced. Such a chemical synthesis method for example includes a sol gel method (a colloid method), a hot soap method, an inverted micelle method, a solvothermal method, a molecular precursor method, a hydrothermal synthesis method, a flux method, etc. Preferably, the hot soap method is used as it can suitably produce a semiconductor nanoparticle composed of a compound semiconductor material. Hereinafter, an example of the method of producing semiconductor phosphor nanoparticle 10 by the hot soap method is indicated.

Initially, nano particle core 2 is synthesized in liquid phase. For example, when semiconductor nano particle core 2 composed of InN is produced, 1-octadecene (a synthesizing solvent) is introduced into a flask or the like and tris(dimethylamino) indium and hexadecanethiol (HDT) are mixed together. The liquid mixture is then agitated sufficiently and then made to react at 180-500 degrees centigrade. Thus, nano particle core 2 composed of InN is obtained, and nano particle core 2 thus obtained has an external surface with HDT bonded thereto. Note that HDT may be added after shell layer 4 is grown.

Preferably, the synthesizing solvent used for the hot soap method is a compound solution composed of a carbon atom and a hydrogen atom (hereinafter referred to as a "hydrocarbon-based solvent"). This prevents introduction of water or oxygen into the synthesizing solvent and hence prevents oxidization of nano particle core 2. Preferably, the hydrocarbon-based solvent is for example n-pentane, n-hexane, n-heptane, n-octane, cyclopentane, cyclohexane, cycloheptane, benzene, toluene, o-xylene, m-xylene, p-xylene or the like.

In the hot soap method, theoretically, a longer reaction time allows a semiconductor nano particle core to have a larger particle diameter. Accordingly, the size of the semiconductor nano particle core is controllable to be a desired size by liquid phase synthesis while monitoring a particle diameter by photoluminescence or light absorption or the like.

Then, a reaction reagent which is a source material for shell layer 4 is added to the solution containing nano particle core 2, and made to undergo pyrogenetic reaction. Thus, a starting material for the semiconductor phosphor nanoparticle is obtained. The starting material for the semiconductor phosphor nanoparticle thus obtained has nano particle core 2 having an external surface coated with shell layer 4, and has HDT bonded to an external surface of shell layer 4.

Subsequently, a modifying organic compound is added to the solution containing the starting material for the semiconductor phosphor nanoparticle, and made to react at room temperature to 300 degrees centigrade. This resolves the bond of the external surface of shell layer 4 and HDT, and the modifying organic compound is bonded to the external surface of shell layer 4 through Si—O bonding to form modifying organic compound layer 6. Thus, semiconductor phosphor nanoparticle 10 of the present embodiment is obtained.

Note that when nano particle core 2 is produced, the modifying organic compound may be added instead of HDT. When semiconductor phosphor nanoparticle 10 is thus obtained, it is not necessary to add the modifying organic compound after shell layer 4 is formed.

[Second Production Method]

One example of a method of producing a semiconductor phosphor nanoparticle according to the second embodiment will now be described hereinafter.

A method similar to that of the first embodiment is used to obtain nano particle core 2. A reaction reagent which is a source material for shell layer 4 is added to the solution containing nano particle core 2, and made to undergo pyrogenetic reaction. Then, a reaction reagent which is a source material for buffer layer 8 is added to the solution after the pyrogenetic reaction, and made to undergo pyrogenetic reaction. Thus a starting material for a semiconductor phosphor nanoparticle is obtained in which nano particle core 2 has an external surface coated with shell layer 4, shell layer 4 has an external surface coated with buffer layer 8, and HDT is bonded to an external surface of buffer layer 8.

Subsequently, a modifying organic compound is added to the solution containing the starting material for the semiconductor phosphor nanoparticle, and made to react at room temperature to 300 degrees centigrade. This resolves the bond of the external surface of buffer layer 8 and HDT, and the modifying organic compound is bonded to the external surface of buffer layer 8 through Si—O bonding to form modifying organic compound layer 6. Thus, semiconductor phosphor nanoparticle 30 of the present embodiment is obtained.

[Third Production Method] A method of producing semiconductor phosphor nanoparticle 10 according to the third embodiment includes the steps of: obtaining a semiconductor nanoparticle; forming the first coating layer on a surface of said semiconductor nanoparticle; and forming the second coating layer on an outer surface of said first coating layer.

One example of the method of producing a semiconductor phosphor nanoparticle according to the third embodiment will now be described hereinafter.

The third production method also allows the aforementioned hot soap method to be used to produce a semiconductor nanoparticle. The hot soap method allows a semiconductor nano particle core to be controlled in sized to have a desired size.

Initially, a source material of a group III-V compound semiconductor will be described. Used as a semiconductor source material for semiconductor nanoparticle 2 are a group 13 element source material including at least one type of indium (In), cadmium (Cd), zinc (Zn), and gallium (Ga), and a group 15 element source material including at least one type of phosphorus (P), arsenic (As), antimony (Sb) and bismuth (Bi). For example, a method in which a group 13 element source material such as gallium trichloride ($GaCl_3$) and indium trichloride ($InCl_3$), and a group 15 element source material such as trimethylsilylphosphine ($P[Si(CH_3)_3]_3$) and dimethylaminophosphine ($P[N(CH_3)_2]_3$) are made to react in an organic solvent, is suitably used. When there are a plurality of types of semiconductor source materials, it is preferable that the semiconductor source materials be previously mixed together and subsequently introduced into a reactor, however, these may be independently introduced into the reactor. The semiconductor source material may be used in the form of a solution using an appropriate diluent solvent.

Among group 13 element source materials, indicated as examples of an indium source material containing indium are: a halide of a group 13 element such as indium trichloride ($InCl_3$), indium tribromide ($InBr_3$), indium triiodide ($InI_3$), etc.; a dialkyl monohalide of a group 13 element such as dimethylindium chloride ($InCl(CH_3)_2$), diethylindium chloride ($InCl(C_2H_5)$) diethylindium bromide ($InBr(C_2H_5)_2$), and diethylindium iodide ($InI(C_2H_5)_2$), etc.; a monoalkyl dihalide of a group 13 element such as methylindium dichloride ($InCl_2(C_2H_5)$), ethylindium dichloride ($InCl_2(C_2H_5)$), ethylindium dibromide ($InBr_2(C_2H_5)$), and ethylindium diiodide ($InI_2(C_2H_5)$), etc.; fatty acids of a group 13 element such as indium triacetate ($In(CH_3COO)_3$) and indium tridodecanoate ($In(CH_{11}COO)_3$), indium tritetradecanoate ($In(CH_{13}COO)_3$) indium trihexadecanoate ($In(CH_{15}COO)_3$) indium trioctadecanoate ($In(CH_{17}COO)_3$); organic metals of a group 13 element such as trimethylindium ($In(CH_3)_3$) and triethylindium ($In(C_2H_5)_3$) etc.; and the like. Among group 13 element source materials, indicated as examples of a gallium source material containing gallium are the above indium source materials with indium replaced with gallium.

Examples of the group 15 element source material serving as the semiconductor source material are tristrimethylsilylphosphine ($P[Si(CH_3)_3]_3$), trisdimethylaminophosphine ($P[N(CH_3)_2]_3$), trioctylphosphine oxide, tris(dimethylamino)arsine, tris(diethylamino)phosphine, tris(diethylamino)arsine, trioctylphosphine, and the like.

By using the above source materials, a semiconductor nanoparticle can be produced in which the group 15 element of the surface of semiconductor nanoparticle 2 has a strong bond to an oxygen atom. Furthermore, by using the source materials, a semiconductor nanoparticle which has a small particle diameter and excellent emission efficiency can be produced more conveniently than conventional.

Note that in the present invention the molar ratio of the group 15 element source material/the group 13 element source material is preferably in a range of 0.01-10. This is because mixing the source materials in that range allows a semiconductor nanoparticle to be produced efficiently.

One example of the production method in the present invention utilizing the hot soap method is as follows: Initially, the above described group 15 element source material and group 13 element source material, and a synthesizing solvent are mixed together, i.e., a source material mixing step is performed. Then, the temperature of the mixture of the source materials is increased to synthesize the source materials, i.e., a reaction step is performed. In the reaction step, a semiconductor nanoparticle is synthesized. Note that, as the synthetic solvent used for the hot soap method, the above-mentioned hydrocarbon solvent or the like can be similarly used.

Then, the semiconductor nanoparticle has a surface etched with a HF aqueous solution while being exposed to ultraviolet light to terminate a dangling bond of the surface of the semiconductor nanoparticle with fluorine (F). Subsequently, the semiconductor nanoparticle having the surface terminated with fluorine (F) is exposed to oxygen to covalently bond an oxygen atom to the group 15 element which is present in a surface area of the semiconductor nanoparticle. Thus, the first coating layer is formed on a surface of the semiconductor nanoparticle.

Then, the silane-based modifying agent is made to react with the semiconductor nanoparticle having the first coating layer formed thereon. The silane-based modifying agent is hydrolyzed with water to produce a silanol group. The silanol group forms a hydrogen bond with an oxygen atom contained in the first coating layer or performs dehydrating condensation reaction to form a chemical bond. Furthermore, a plurality of hydrolyzed silane-based modifying agents bond together through siloxane bonding to form the second coating layer. Thus, a semiconductor phosphor nanoparticle of the present embodiment can be obtained in which on a surface of a semiconductor nanoparticle the first coating layer and the second coating layer are formed in said order.

[Fourth Production Method]

Semiconductor phosphor nanoparticle 20 of the fourth embodiment can be produced for example in the following production method:

Initially, a method similar to that of the third embodiment is used to form the first coating layer on the surface of the semiconductor nanoparticle.

Then, a sol gel method, a liquid phase reduction method, a hydrothermal synthesis method or the like is applied to the semiconductor nanoparticle having the first coating layer formed thereon to form an inorganic crystal on a surface of the semiconductor nanoparticle.

Then, a method similar to that of the third embodiment is used to make the silane-based modifying agent react with the semiconductor nanoparticle having the first coating layer formed thereon to form the second coating layer. Thus, a semiconductor phosphor nanoparticle of the present embodiment can be obtained.

[Fifth Production Method]

Semiconductor phosphor nanoparticle 30 of the fifth embodiment can be produced for example in the following method:

Initially, a method similar to that of the third embodiment is used to form the first coating layer on the surface of the semiconductor nanoparticle.

Then, a method similar to that of the third embodiment is used to make a silane-based modifying agent having a different functional group react with the semiconductor nanoparticle having the first coating layer formed thereon to form the second coating layer. Herein "a silane-based modifying agent having a different functional group" means that a silane-based modifying agent represented by the following general formula:

$$R-Si(OR')_3 \qquad (3)$$

has a functional group represented by R which is different. Thus, a semiconductor phosphor nanoparticle of the present embodiment can be obtained.

<Semiconductor Phosphor Nanoparticle-Containing Glass>

Semiconductor phosphor nanoparticle-containing glass according to the present invention will now be described with reference to FIG. 10. FIG. 10 is a schematic diagram showing semiconductor phosphor nanoparticle-containing glass.

As shown in FIG. 10, semiconductor phosphor nanoparticle-containing glass 40 includes silica-based glass 12 and a plurality of semiconductor phosphor nanoparticles 60 dispersed in silica-based glass 12. Semiconductor phosphor nanoparticle 60 includes semiconductor nanoparticle 2 containing a group 15 element in the periodic table of elements, that is at least one type selected from the group consisting of phosphorus, arsenic, antimony and bismuth, and first coating layer 4 formed on a surface of semiconductor nanoparticle 2 and including a group 15 element and an oxygen atom bonded to said group 15 element. An outer surface of first coating layer 4 and silica-based glass 12 are bonded through siloxane bonding.

Silica-based glass 12 is obtained by causing a condensation reaction of the silane-based modifying agent represented by the above formula (3). Silica-based glass 12 and an outer surface of the first coating layer of semiconductor phosphor nanoparticle 10 are bonded through siloxane bonding. Note that herein the siloxane bonding is discussed as being included in silica-based glass 12. This allows semiconductor phosphor nanoparticle 60 to be contained in silica-based glass 12 at high concentration.

<Method of Producing Semiconductor Phosphor Nanoparticle-Containing Glass>

Semiconductor phosphor nanoparticle-containing glass 40 according to the present invention can be produced for example by the following method:

Initially, a method similar to that of the third embodiment is used to form first coating layer 4 on the surface of semiconductor nanoparticle 2.

Then, semiconductor phosphor nanoparticle 60 having first coating layer 4 is introduced into the silane-based modifying agent, and the silane-based modifying agent is made to undergo condensation reaction to form silica-based glass. When the silane-based modifying agent undergoes condensation reaction, the outer surface of semiconductor phosphor nanoparticle 40 is bonded to the silica-based glass through siloxane bonding. Thus, semiconductor phosphor nanoparticle-containing glass in which semiconductor phosphor nanoparticle 60 is dispersed in silica-based glass formed by the condensation reaction of the silane-based modifying agent, can be obtained.

<Light Emitting Device>

A light emitting device according to the present invention will now be described with reference to FIG. 11.

As shown in FIG. 11, a light emitting device 50 includes an organic medium 14 and a plurality of semiconductor phosphor nanoparticles 10 dispersed in organic medium 14. While FIG. 11 shows semiconductor phosphor nanoparticle 10 of the third embodiment as a semiconductor phosphor nanoparticle, semiconductor phosphor nanoparticles 20 and 30 of the fourth and fifth embodiments can also be used as the semiconductor phosphor nanoparticle. Furthermore, the semiconductor phosphor nanoparticles of the third to fifth embodiments may be mixed together and thus used.

The plurality of semiconductor phosphor nanoparticles 10 are dispersed in organic medium 14. In the semiconductor phosphor nanoparticles of the third to fifth embodiments, the second coating layer which includes Si—O bonding is formed on an outer side of a semiconductor nanoparticle, and accordingly semiconductor nanoparticles never contact each other. Accordingly, an interface defect is not made between the plurality of semiconductor phosphor nanoparticles, and the semiconductor phosphor nanoparticle can be closest-packed in the organic medium. The semiconductor phosphor nanoparticles of the third to fifth embodiments including at a surface the second coating layer including Si—O bonding can thus be contained in an organic medium stably at high concentration.

As organic medium 14, a glass material or a macromolecular material is preferably used. As the glass material, tetramethoxy silane (TMOS), tetraethoxysilane (TEOS), tetrapropoxysilane, tetrabutoxysilane, etc. can be used for example. As the macromolecular material, acrylic resin such as polymethylmethacrylate (PMMA), epoxy resin composed of bisphenol A and epichlorohydrin, etc. can be used for example.

The volume ratio of semiconductor phosphor nanoparticle 10 to organic medium 14 can have a value depending on the application of the light emitting device, and preferably it is 0.000001 or more and 10 or less. When the volume ratio is 0.000001 or more and 10 or less, the semiconductor phosphor nanoparticle less easily aggregates and is dispersible in an organic medium more uniformly. Furthermore, when the light emitting device's transparency is regarded as important, it is preferable that the volume ratio of the semiconductor phosphor nanoparticle to the organic medium is 0.2 or less, and it is more preferable that the volume ratio is 0.1 or less. The volume ratio of 0.2 or less allows a highly transparent light emitting device and the volume ratio of 0.1 or less allows a further highly transparent light emitting device. Furthermore, when the quantity of light emitted by the light emitting device is regarded as important, it is preferable that the volume ratio of the semiconductor phosphor nanoparticle to the organic medium is 0.00001 or more. The volume ratio of 0.00001 or more allows the light emitting device to emit a large quantity of light.

Organic medium 14 contains preferably 80% by volume or more, more preferably 90% by volume or more of the glass material or macromolecular material. When the organic medium contains 80% by volume or more of the glass material or macromolecular material, a highly transparent or highly efficient light emitting device can be provided, and when the organic medium contains 90% by volume or more of the material, a further highly transparent or further highly efficient light emitting device can be provided.

<Method of Producing Light Emitting Device>

When semiconductor phosphor nanoparticle 51 is sealed in organic medium 14, a process is performed in which semiconductor phosphor nanoparticle 51 is dispersed in organic medium 14 and thereafter hardened.

When the glass material is used as organic medium 14, a solution in which the glass material and the semiconductor phosphor nanoparticle are mixed together is agitated to disperse the semiconductor phosphor nanoparticle in the glass material. Then, the glass material is made to undergo condensation reaction and thus hardened. In order to accelerate the condensation reaction, heat, an acid or a base and/or the like may be applied to the system.

When the macromolecular material is used as organic medium 14, a solution in which the macromolecular material and the semiconductor phosphor nanoparticle are mixed together is agitated to disperse the semiconductor phosphor nanoparticle in the macromolecular material. Then, the macromolecular material is made to undergo condensation reaction and thus hardened and resinified (or solidified). The hardening can be done by a photo-curing method exposing the intermediate product to ultraviolet rays and thus hardening it, a thermosetting method applying heat to the intermediate product and thus hardening it, etc.

<Light Emitting Element>

A light emitting element according to the present invention is a light emitting element including the semiconductor phosphor nanoparticle of the first or second embodiment. In the present embodiment, the semiconductor phosphor nanoparticle may be one type thereof or two or more types thereof combined together. Furthermore, the semiconductor phosphor nanoparticles of the third to fifth embodiments may be used.

Preferably, the light emitting element includes a matrix and a semiconductor phosphor nanoparticle dispersed in the matrix. The semiconductor phosphor nanoparticle of the first or second embodiment has an outermost surface with a modifying organic compound layer, and such semiconductor phosphor nanoparticles never contact each other. Accordingly, an interface defect is not made between a plurality of semiconductor phosphor nanoparticles, and the semiconductor phosphor nanoparticle can be closest-packed in the matrix.

As the matrix, a glass material or a macromolecular material is preferably used. As the glass material, tetramethoxy silane (TMOS), tetraethoxysilane (TEOS), tetrapropoxysilane, tetrabutoxysilane, etc. can be used for example. As the macromolecular material can be used: acrylic resin such as polymethylmethacrylate (PMMA); epoxy resin composed of bisphenol A and epichlorohydrin, etc.; a resin which includes a constitutional unit derived from an ionic liquid composed of MOE-200T (2-(methacryloyloxy)-ethyltrimethyl ammonium bis(trifluoromethane sulfonyl)imide), 1-(3-acryloyloxy-propyl)-3-methylimidazolium ethyltrimethyl ammonium bis(trifluoromethane sulfonyl)imide, etc.; etc. Inter alia, using the resin including the constitutional unit derived from the ionic liquid as the matrix is preferable as it is believed that an electrostatic effect derived from the ionic liquid stabilizes the semiconductor phosphor nanoparticle.

What type of matrix and what type of semiconductor phosphor nanoparticle are combined is not particularly limited. For example, it is preferable that the matrix be the resin including the constitutional unit derived from the ionic liquid and the semiconductor phosphor nanoparticle be the semiconductor phosphor nanoparticle which includes a polar functional group at a surface of the modifying organic compound layer, since by an electrostatic effect derived from the ionic liquid the semiconductor phosphor nanoparticle is stabilized and also has a tendency to be dispersible in the matrix, which facilitates producing the light emitting element. Furthermore, it is preferable that the matrix be the resin including the constitutional unit derived from the ionic liquid and the semiconductor phosphor nanoparticle be the semiconductor phosphor nanoparticle which includes an ionic functional group at a surface of the modifying organic compound layer, since an electrostatic effect derived from the ionic liquid stabilizes the semiconductor phosphor nanoparticle, and the semiconductor phosphor nanoparticle is also high in polarity and has ionicity and has a nature close to that of the resin including the constitutional unit derived from the ionic liquid and accordingly, the semiconductor phosphor nanoparticle has a tendency to be significantly satisfactorily dispersible in the matrix, which further facilitates producing the light emitting element.

The volume ratio of the semiconductor phosphor nanoparticle to the matrix can have a value depending on the application of the light emitting element, and preferably it is 0.000001 or more and 10 or less. When the volume ratio is 0.000001 or more and 10 or less, the semiconductor phosphor nanoparticle less easily aggregates and is dispersible in the matrix more uniformly. Furthermore, when the light emitting element's transparency is regarded as important, it is preferable that the volume ratio of the semiconductor phosphor nanoparticle to the matrix is 0.2 or less, and it is more preferable that the volume ratio is 0.1 or less. The volume ratio of 0.2 or less allows a highly transparent light emitting element and the volume ratio of 0.1 or less allows a further highly transparent light emitting element. Furthermore, when the quantity of light emitted by the light emitting element is regarded as important, it is preferable that the volume ratio of the semiconductor phosphor nanoparticle to the matrix is 0.00001 or more. The volume ratio of 0.00001 or more allows the light emitting element to emit a large quantity of light.

The matrix contains preferably 80% by volume or more, more preferably 90% by volume or more of the glass material or macromolecular material. When the matrix contains 80% by volume or more of the glass material or macromolecular material, a highly transparent or highly efficient light emitting element can be provided, and when the matrix contains 90% by volume or more of the material, a further highly transparent or further highly efficient light emitting element can be provided.

<Method of Producing Light Emitting Element>

When the semiconductor phosphor nanoparticle is sealed in the matrix, a process is performed in which the semiconductor phosphor nanoparticle is dispersed in the matrix and thereafter hardened.

When the glass material is used as the matrix, a solution in which the glass material and the semiconductor phosphor nanoparticle are mixed together is agitated to disperse the semiconductor phosphor nanoparticle in the glass material. Then, the glass material is made to undergo condensation reaction and thus hardened. In order to accelerate the condensation reaction, heat, an acid or a base and/or the like may be applied to the system.

When the macromolecular material is used as the matrix, a solution in which the macromolecular material and the semiconductor phosphor nanoparticle are mixed together is agitated to disperse the semiconductor phosphor nanoparticle in the macromolecular material. Then, the macromolecular material is made to undergo condensation reaction and thus hardened and resinified (or solidified). The hardening can be done by a photo-curing method exposing the intermediate product to ultraviolet rays and thus hardening it, a thermosetting method applying heat to the intermediate product and thus hardening it, etc.

When the resin including the constitutional unit derived from the ionic liquid is used as the matrix, a solution in which the ionic liquid and the semiconductor phosphor nanoparticle are mixed together is agitated to disperse the semiconductor phosphor nanoparticle in the ionic liquid. Then, the ionic liquid is made to undergo condensation reaction and thus hardened and resinified (or solidified) to form the resin including the constitutional unit derived from the ionic liquid. The hardening can be done by a photo-curing method exposing the intermediate product to ultraviolet rays and thus hardening it, a thermosetting method applying heat to the intermediate product and thus hardening it, etc.

EXAMPLES

The present invention will now be more specifically in examples. Note, however, that these examples do not limit the present invention. Hereinafter, "A/B" represents that A is coated with B.

Inventive Example 1

(Production of Semiconductor Phosphor Nanoparticle)

A toluene/butanol solution containing a semiconductor phosphor nanoparticle composed of a nano particle core of InP, a shell layer of ZnS, and a modifying organic compound layer of hexadecanethiol (HDT), was prepared. Then, in the semiconductor phosphor nanoparticle containing toluene/butanol solution, 5 equivalents of n-trimethoxysilyl butanoic acid (TMSBA) was added as an additional modifying organic compound relative to 1 equivalent of the semiconductor phosphor nanoparticle and made to react with the semiconductor phosphor nanoparticle in a nitrogen atmosphere at 70 degrees centigrade for 3 hours to remove HDT on the shell layer and also bond TMSBA on the shell layer. Subsequently, a centrifugal separation step was performed to remove from the system the HDT dissociated from the shell layer, and unreacted TMSBA. Subsequently, a drying step was performed and a semiconductor phosphor nanoparticle of InP/ZnS/TMSBA with a modifying organic compound layer of TMSBA was obtained. The obtained semiconductor phosphor nanoparticle had satisfactory aqueous dispersibility.

(Production of Light Emitting Element)

The obtained semiconductor phosphor nanoparticle was dispersed in polymethylmethacrylate (PMMA), and subjected to a hardening process and thus resin-sealed to produce a light emitting element.

(Performance Assessment)

The obtained light emitting element was let to absorb excitation light having a wavelength of 450 nm to emit fluorescent light and the emission's intensity was measured, and the ratio of the number of emitting photons to the number of absorbed photons was presented as emission efficiency.

(Assessment Result)

The light emitting element of inventive example 1 presented quantum efficiency having a satisfactory value. Furthermore, as the semiconductor phosphor nanoparticle of inventive example 1 has aqueous dispersibility, it is also applicable to a process of a low environmental burden and a low cost using water.

Comparative Example 1

(Production of Semiconductor Phosphor Nanoparticle)

A toluene/butanol solution containing a semiconductor phosphor nanoparticle composed of a nano particle core of InP, a shell layer of ZnS, and a modifying organic compound layer of myristic acid (MA), was prepared. A centrifugal separation step was performed to remove from the system the MA dissociated from the shell layer. Subsequently, a drying step was performed and a semiconductor phosphor nanoparticle of InP/ZnS/MA with a modifying organic compound layer of MA was obtained.

(Production of Light Emitting Element)

The obtained semiconductor phosphor nanoparticle was dispersed in polymethylmethacrylate (PMMA), and subjected to a hardening process and thus resin-sealed to produce a light emitting element.

(Performance Assessment)

The obtained light emitting element was let to absorb excitation light having a wavelength of 450 nm to emit fluorescent light and the emission's intensity was measured, and the ratio of the number of emitting photons to the number of absorbed photons was presented as emission efficiency.

(Assessment Result)

The light emitting element of comparative example 1 presented significantly decreased quantum efficiency. It is believed that this is because in comparative example 1 the bond of the shell layer and the modifying organic compound layer was formed of carboxyl bonding having a weak bonding strength, so that when the resin sealing process was performed, the stress caused in the condensation reaction of the resin material dissociated the carboxyl bonding and thus caused a defect in the shell layer.

Inventive Example 2

(Production of Semiconductor Phosphor Nanoparticle)

A toluene/butanol solution containing a semiconductor phosphor nanoparticle composed of a nano particle core of InP, a shell layer of ZnS, and a modifying organic compound layer of hexadecanethiol (HDT), was prepared. Then, in the semiconductor phosphor nanoparticle containing toluene/butanol solution, 5 equivalents of 3-aminopropyldimethylethoxysilane (APDMES) was added as an additional modifying organic compound relative to 1 equivalent of the semiconductor phosphor nanoparticle and made to react with the semiconductor phosphor nanoparticle in a nitrogen atmosphere at 70 degrees centigrade for 3 hours to remove HDT on the shell layer and also bond APDMES on the shell layer. Subsequently, a centrifugal separation step was performed to remove from the system the HDT dissociated from the shell layer, and unreacted APDMES. Subsequently, a drying step was performed and a semiconductor phosphor nanoparticle of InP/ZnS/APDMES with a modifying organic compound layer of APDMES was obtained. The obtained semiconductor phosphor nanoparticle had satisfactory aqueous dispersibility.

(Production of Light Emitting Element)

The obtained semiconductor phosphor nanoparticle was dispersed in polymethylmethacrylate (PMMA), and subjected to a hardening process and thus resin-sealed to produce a light emitting element.

(Performance Assessment)

The obtained light emitting element was let to absorb excitation light having a wavelength of 450 nm to emit fluorescent light and the emission's intensity was measured, and the ratio of the number of emitting photons to the number of absorbed photons was presented as emission efficiency.

(Assessment Result)

The light emitting element of inventive example 2 presented quantum efficiency having a better value than that of inventive example 1. It is believed that this is because in inventive example 2 each modifying organic compound bonds to the shell layer through Si—O bonding of a single location, and no other Si—O bonding exists in the modifying organic compound layer and no oxygen atom exists that reacts with the glass material or the macromolecular material, so that there is no possibility that an unreacted alkoxy group or the like reacts with the resin material to generate stress that can eliminate the modifying organic compound. Furthermore, as the semiconductor phosphor nanoparticle of inventive example 2 has aqueous dispersibility, it is also applicable to a process of a low environmental burden and a low cost using water.

Inventive Example 3

(Production of Semiconductor Phosphor Nanoparticle)

A toluene/butanol solution containing a semiconductor phosphor nanoparticle composed of a nano particle core of InP, a shell layer of ZnS, and a modifying organic compound layer of hexadecanethiol (HDT), was prepared. Then, in the semiconductor phosphor nanoparticle containing toluene/butanol solution, 5 equivalents of N-trimethoxysilylpropyl-N, N, N-trimethyl ammonium chloride (TMSP-TMA) was added as an additional modifying organic compound relative to 1 equivalent of the semiconductor phosphor nanoparticle and made to react with the semiconductor phosphor nanoparticle in a nitrogen atmosphere at 50 degrees centigrade for 3 hours to remove HDT on the shell layer and also bond TMSP-TMA on the shell layer. Subsequently, a centrifugal separation step was performed to remove from the system the HDT dissociated from the shell layer, and unreacted TMSP-TMA. Subsequently, a drying step was performed and a semiconductor phosphor nanoparticle of InP/ZnS/TMSP-TMA with a modifying organic compound layer of TMSP-TMA was obtained. The obtained semiconductor phosphor nanoparticle had significantly satisfactory aqueous dispersibility. It is believed that this is because it has an ammonium group of the ionic functional group at an outer surface of the modifying organic compound layer.

(Production of Light Emitting Element)

The obtained semiconductor phosphor nanoparticle was dispersed in an ionic liquid (MOE-200T; compound name: (2-(methacryloyloxy)-ethyltrimethyl ammonium bis(trifluoromethane sulfonyl)imide)), and subjected to a hardening process and thus resin-sealed to produce a light emitting element.

(Performance Assessment)

The obtained light emitting element was let to absorb excitation light having a wavelength of 450 nm to emit fluorescent light and the emission's intensity was measured, and the ratio of the number of emitting photons to the number of absorbed photons was presented as emission efficiency.

(Assessment Result)

The light emitting element of inventive example 3 presented quantum efficiency having a better value than that of inventive example 1. It is believed that this is because, by sealing a semiconductor phosphor nanoparticle having an ionic functional group at an outer surface of a modifying organic compound layer with a resin including a constitutional unit derived from an ionic liquid, an electrostatic effect stabilizes the semiconductor phosphor nanoparticle. Furthermore, as the semiconductor phosphor nanoparticle of inventive example 3 has aqueous dispersibility, it is also applicable to a process of a low environmental burden and a low cost using water.

Inventive Example 4

(Production of Semiconductor Phosphor Nanoparticle)

A toluene/butanol solution containing a semiconductor phosphor nanoparticle composed of a nano particle core of InN, a shell layer of InGaN, a buffer layer of ZnO and a modifying organic compound layer of hexadecanethiol (HDT), was prepared. Then, in the semiconductor phosphor nanoparticle containing toluene/butanol solution, 5 equivalents of n-trimethoxysilyl butanoic acid (TMSBA) was added as an additional modifying organic compound relative to 1 equivalent of the semiconductor phosphor nanoparticle and made to react with the semiconductor phosphor nanoparticle in a nitrogen atmosphere at 70 degrees centigrade for 3 hours to remove HDT on the buffer layer and also bond TMSBA on the buffer layer. Subsequently, a centrifugal separation step was performed to remove from the system the HDT dissociated from the buffer layer, and unreacted TMSBA. Subsequently, a drying step was performed and a semiconductor phosphor nanoparticle of InN/InGaN/ZnO/TMSBA with a modifying organic compound layer of TMSBA was obtained. The obtained semiconductor phosphor nanoparticle had satisfactory aqueous dispersibility.

(Production of Light Emitting Element)

The obtained semiconductor phosphor nanoparticle was dispersed in polymethylmethacrylate (PMMA), and subjected to a hardening process and thus resin-sealed to produce a light emitting element.

(Performance Assessment)

The obtained light emitting element was let to absorb excitation light having a wavelength of 450 nm to emit fluorescent light and the emission's intensity was measured, and the ratio of the number of emitting photons to the number of absorbed photons was presented as emission efficiency.

(Assessment Result)

The light emitting element of inventive example 4 presented quantum efficiency having a satisfactory value. Furthermore, as the semiconductor phosphor nanoparticle of inventive example 4 has aqueous dispersibility, it is also applicable to a process of a low environmental burden and a low cost using water.

Inventive Example 5

(Production of Semiconductor Phosphor Nanoparticle)

Figure 5:
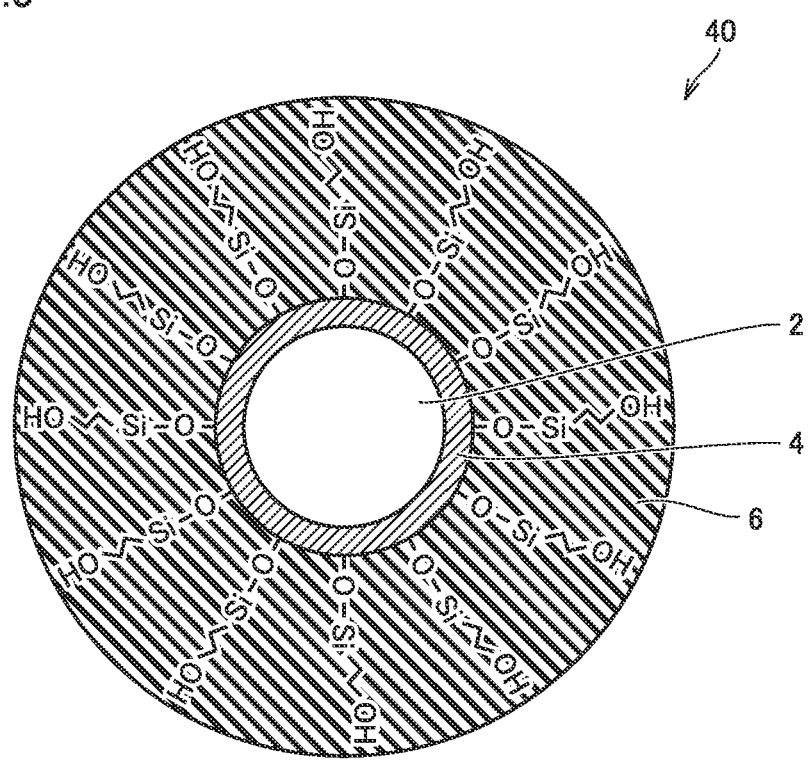
FIG. 5 is a schematic diagram showing a semiconductor phosphor nanoparticle according to an inventive example 5.

A toluene solution containing a semiconductor phosphor nanoparticle composed of a nano particle core of InP, a shell layer of ZnS, and a modifying organic compound layer of hexadecanethiol (HDT), was prepared. Then, in the semiconductor phosphor nanoparticle containing toluene solution, 5 equivalents of octadecyltrimethoxysilane (ODTMS) was added as an additional modifying organic compound relative to 1 equivalent of the semiconductor phosphor nanoparticle and made to react with the semiconductor phosphor nanoparticle in a nitrogen atmosphere at 70 degrees centigrade for 3 hours to remove HDT on the shell layer and also bond ODTMS on the shell layer. Subsequently, a centrifugal separation step was performed to remove from the system the HDT dissociated from the shell layer, and unreacted ODTMS. Subsequently, a drying step was performed and a semiconductor phosphor nanoparticle of InP/ZnS/ODTMS with a modifying organic compound layer of ODTMS was obtained. This semiconductor phosphor nanoparticle was exposed to 172 nm excimer lamp light. The obtained semiconductor phosphor nanoparticle was measured with $^1$H-NMR, and it was confirmed that an OH group was present. The semiconductor phosphor nanoparticle of inventive example 5 is considered to include an OH group at a surface of the modifying organic compound layer, as shown in FIG. 5. The obtained semiconductor phosphor nanoparticle had satisfactory aqueous dispersibility.

(Production of Light Emitting Element)

The obtained semiconductor phosphor nanoparticle was dispersed in tetraethoxysilane (TEOS), and subjected to a hardening process and thus glass-sealed to produce a light emitting element. The obtained semiconductor phosphor nanoparticle significantly satisfactorily dispersed in the glass. It is believed that this is because by exposure to excimer lamp light, a $CH_3$ terminal of an alkyl chain which forms the modifying organic compound layer was able to be converted into a water-soluble OH group having a good affinity with glass ($SiO_2$).

(Performance Assessment)

The obtained light emitting element was let to absorb excitation light having a wavelength of 450 nm to emit fluorescent light and the emission's intensity was measured, and the ratio of the number of emitting photons to the number of absorbed photons was presented as emission efficiency.

(Assessment Result)

The light emitting element of inventive example 5 presented quantum efficiency having a satisfactory value. Furthermore, as the semiconductor phosphor nanoparticle of inventive example 5 has aqueous dispersibility, it is also applicable to a process of a low environmental burden and a low cost using water.

Inventive Example 6

(Production of Semiconductor Phosphor Nanoparticle)

Indium laurate (0.5 mmol), tristrimethylsilylphosphine $(TMS)_3P$ (1.0 mmol), and 10 ml of hexadecane were added and heated at approximately 180 degrees centigrade for 1 hour. Thus a solution was obtained which contained InP colloidal particles each having a surface protected by indium laurate. This was subjected to ultraviolet exposure using 2% by volume of an HF solution to undergo surface-etching and was then exposed to the atmospheric air to obtain a solution which contains InP colloidal particles each having a surface terminated with oxygen. To this, 3-aminopropyldimethylchlorosilane (0.5 mmol) was added, and the mixture was heated at approximately 80 degrees centigrade for 1 hour to obtain a solution which contains InP colloidal particles each having a surface protected by 3-aminopropyldimethylchlorosilane, that is, a semiconductor phosphor nanoparticle.

(Production of Light Emitting Device)

The obtained semiconductor phosphor nanoparticle was dispersed in poly methyl methacrylate resin (PMMA), and subjected to a hardening process to produce a light emitting device in which the semiconductor phosphor nanoparticle was dispersed in an organic medium. The semiconductor phosphor nanoparticle and PMMA were mixed at a volume ratio of 1:1000.

(Performance Assessment)

The obtained semiconductor phosphor nanoparticle was let to absorb excitation light having a wavelength of 450 nm to emit fluorescent light and the emission's intensity was measured, and the ratio of the number of emitting photons to the number of absorbed photons was presented as emission efficiency.

(Assessment Result)

The semiconductor phosphor nanoparticle of inventive example 6 presented excellent emission efficiency.

Inventive Example 7

(Production of Semiconductor Phosphor Nanoparticle)

Indium laurate (0.5 mmol), tristrimethylsilylphosphine $(TMS)_3P$ (1.0 mmol), and 10 ml of hexadecane were added and heated at approximately 180 degrees centigrade for 1 hour.

Thus a solution was obtained which contained InP colloidal particles each having a surface protected by indium laurate. This was subjected to ultraviolet exposure using 2% by volume of an HF solution to undergo surface-etching and was then exposed to the atmospheric air to obtain a solution which contains InP colloidal particles each having a surface terminated with oxygen. To this, 3-aminopropyldimethylchlorosilane (0.5 mmol) was added, and the mixture was heated at approximately 80 degrees centigrade for 1 hour to obtain a solution of InP colloidal particles each having a surface protected by 3-aminopropyldimethylchlorosilane. This was then hydrolyzed to obtain a $SiO_2$ layer-coated, InP semiconductor phosphor nanoparticle-dispersed solution.

(Production of Light Emitting Device)

The obtained semiconductor phosphor nanoparticle was dispersed in poly methyl methacrylate resin (PMMA), and subjected to a hardening process to produce a light emitting device in which the semiconductor phosphor nanoparticle was dispersed in an organic medium. The semiconductor phosphor nanoparticle and PMMA were mixed at a volume ratio of 1:1000.

(Performance Assessment)

The obtained semiconductor phosphor nanoparticle was let to absorb excitation light having a wavelength of 450 nm to emit fluorescent light and the emission's intensity was measured, and the ratio of the number of emitting photons to the number of absorbed photons was presented as emission efficiency.

(Assessment Result)

The semiconductor phosphor nanoparticle of inventive example 7 presented excellent emission efficiency.

Inventive Example 8

(Production of Semiconductor Phosphor Nanoparticle)

Indium laurate (0.5 mmol), tristrimethylsilylphosphine $(TMS)_3P$ (1.0 mmol), and 10 ml of hexadecane were added and heated at approximately 180 degrees centigrade for 1 hour. Thus a solution was obtained which contained InP colloidal particles each having a surface protected by indium laurate. This was subjected to ultraviolet exposure using 2% by volume of an HF solution to undergo surface-etching and was then exposed to the atmospheric air to obtain a solution which contains InP colloidal particles each having a surface terminated with oxygen. To this, titanium tetra isopropoxide (0.2 mmol) was added, and hydrolyzed to form a $TiO_2$ microcrystal on said InP. To this, 3-aminopropyldimethylchlorosilane (0.5 mmol) was added, and the mixture was heated at approximately 80 degrees centigrade for 1 hour, and furthermore hydrolyzed to obtain a $SiO_2$ layer-coated, InP semiconductor phosphor nanoparticle-dispersed solution.

(Production of Light Emitting Device)

The obtained semiconductor phosphor nanoparticle was dispersed in poly methyl methacrylate resin (PMMA), and subjected to a hardening process to produce a light emitting device in which the semiconductor phosphor nanoparticle was dispersed in an organic medium. The semiconductor phosphor nanoparticle and PMMA were mixed at a volume ratio of 1:1000.

(Performance Assessment)

The obtained semiconductor phosphor nanoparticle was let to absorb excitation light having a wavelength of 450 nm to emit fluorescent light and the emission's intensity was measured, and the ratio of the number of emitting photons to the number of absorbed photons was presented as emission efficiency.

(Assessment Result)

The semiconductor phosphor nanoparticle of inventive example 8 presented excellent emission efficiency.

Inventive Example 9

(Production of Semiconductor Phosphor Nanoparticle Containing Glass)

Indium laurate (0.5 mmol), tristrimethylsilylphosphine $(TMS)_3P$ (1.0 mmol), and 10 ml of hexadecane were added and heated at approximately 180 degrees centigrade for 1 hour. Thus a solution was obtained which contained InP colloidal particles each having a surface protected by indium laurate. This was subjected to ultraviolet exposure using 2% by volume of an HF solution to undergo surface-etching and was then exposed to the atmospheric air to obtain a solution which contains InP colloidal particles each having a surface terminated with oxygen. To this, 3-aminopropyldimethylchlorosilane (0.5 mmol) was added, and the mixture was heated at approximately 80 degrees centigrade for 1 hour to obtain a solution of InP colloidal particles each having a surface protected by 3-aminopropyldimethylchlorosilane. To this, 3-aminopropyldimethylchlorosilane (1.0 mmol) was further added, and the mixture was heated and hydrolyzed to obtain InP semiconductor phosphor nanoparticle-containing glass.

(Performance Assessment)

The obtained semiconductor phosphor nanoparticle-containing glass was let to absorb excitation light having a wavelength of 450 nm to emit fluorescent light and the emission's intensity was measured, and the ratio of the number of emitting photons to the number of absorbed photons was presented as emission efficiency.

(Assessment Result)

The semiconductor phosphor nanoparticle of inventive example 9 presented excellent emission efficiency.

While the present invention has been described in embodiments, it should be understood that the embodiments disclosed herein are illustrative and non-restrictive in any respect. The scope of the present invention is defined by the terms of the claims, and is intended to include any modifications within the meaning and scope equivalent to the terms of the claims.

What is claimed is:

1. A semiconductor phosphor nanoparticle comprising:
   a nano particle core composed of a compound semiconductor;
   a first coating layer coating the nano particle core; and
   a second coating layer bonded to an outer surface of the first coating layer through Si—O bonding; wherein
   the second coating layer is a modifying organic compound layer; and
   the modifying organic compound layer includes a polar functional group at a surface thereof.

2. The semiconductor phosphor nanoparticle according to claim 1, wherein the polar functional group is an ionic functional group.

3. The semiconductor phosphor nanoparticle according to claim 1, wherein the first coating layer includes:
 a shell layer coating the nano particle core; and
 a buffer layer coating the shell layer.

4. The semiconductor phosphor nanoparticle according to claim 1, wherein:
 the nano particle core includes a group 15 element in the periodic table of elements, that is at least one type selected from the group consisting of phosphorus, arsenic, antimony and bismuth; and
 the first coating layer is formed on a surface of the semiconductor nanoparticle and includes the group 15 element and an oxygen atom bonded to the group 15 element.

5. The semiconductor phosphor nanoparticle according to claim 1, further comprising an inorganic crystal formed at at least a portion of an outer surface of the first coating layer and having a band gap equal to or greater than 3.0 eV.

6. The semiconductor phosphor nanoparticle according to claim 1, wherein the second coating layer includes two or more types of functional groups.

7. A semiconductor phosphor nanoparticle-containing glass comprising:
 silica-based glass; and
 a semiconductor phosphor nanoparticle dispersed in the silica-based glass,
 the semiconductor phosphor nanoparticle including a semiconductor nanoparticle containing a group 15 element in the periodic table of elements, that is at least one type selected from the group consisting of phosphorus, arsenic, antimony and bismuth, and a first coating layer formed on a surface of the semiconductor nanoparticle and including the group 15 element and an oxygen atom bonded to the group 15 element,
 an outer surface of the first coating layer and the silica-based glass being bonded through siloxane bonding.

8. A light emitting, comprising:
 a matrix; and
 a semiconductor phosphor nanoparticle dispersed in the matrix,
 the semiconductor phosphor nanoparticle including:
 a nano particle core composed of a compound semiconductor,
 a first coating layer coating the nano particle core, and
 a second coating layer bonded to an outer surface of the first coating layer through Si—O bonding, wherein:
 the second coating layer is a modifying organic compound layer; and
 the modifying organic compound layer has a polar functional group at a surface thereof.

9. The light emitting element according to claim 8, wherein the matrix includes a resin including a constitutional unit derived from an ionic liquid.

10. The light emitting element according to claim 8, wherein the polar functional group is an ionic functional group.

* * * * *